2,890,115
Patented June 9, 1959

2,890,115

LITHOPLATE FROM DIAZONIUM-DIAZO-SULFONATES

Oskar Süs and Georg Werner, Wiesbaden-Biebrich, Germany, assignors, by mesne assignments, to Azoplate Corporation, Murray Hill, N.J., a corporation of New Jersey No Drawing. Application August 23, 1955
Serial No. 541,855

Claims priority, application Germany August 26, 1954

33 Claims. (Cl. 96—33)

The present invention relates to the field of making printing plates by photomechanical methods. More particularly, it relates to a new light sensitive material of good storage capacity which can easily be transformed into a printing plate, and to a process of practicing such transformation.

Light sensitive aluminum foils have been previously used for the manufacture of printing plates having as their light sensitive layer, water-soluble diazo compounds. As an example of such compounds, the so-called diazo sulfonates are suited for the production of the light sensitive layer. It has also been suggested to use certain water-insoluble quinone-diazide compounds which are capable of being used for the production of light sensitive metal foils to be transformed into printing plates.

It is an object of this invention to provide still another group of diazo compounds which are characterized by excellent storageability while having a simple chemical constitution. A further object of the invention is the use of certain diazo sulfonate derivatives as the sensitizing material in the production of pre-sensitized printing plates.

The present invention is concerned with a valuable new material of the type described above, consisting of a metal foil or metal plate and a light sensitive layer coated thereon. The light sensitive layer consists of diazo sulfonates of cyclic amines (aromatic as well as heterocyclic) in which the salt-forming cationic component is the diazonium residue of an aromatic or heterocyclic diazo compound.

In addition to its simple constitution, the light-sensitive material according to the present invention is characterized by its excellent storageability. This is probably due to the stability of the diazo sulfonates themselves which exceeds that of other diazo compounds. As a further advantage deriving from the greater stability of the light sensitive substances of the present invention, it is now found to be more convenient to handle the new light sensitive material as well as the diazo sulfonates in manufacturing the new material. It is also a considerable advantage of the light sensitive material of the present invention, that in many instances, upon exposure, colored light transformation products are formed from the light sensitive diazo sulfonates. Due to the formation of said colored light transformation products, a better control of the developing process is possible. Moreover, the coloration of the light struck parts of the layer gives rise to the desired contrast images upon the layer supports.

The diazo compounds to be used in accordance with the present invention, for the preparation of the light sensitive layer, are reaction products of aromatic or heterocyclic diazo sulfonates with diazonium salts of aromatic or heterocyclic amines. Their formation takes place in an aqueous solution and at room temperature, when equimolecular quantities of an alkali metal salt of an aromatic or heterocyclic diazo sulfonic acid and of a diazonium salt of an aromatic or heterocyclic amine are present. The water-insoluble reaction products separate in the form of mostly yellow precipitates and may be recrystallized from organic solvents. They correspond to the general formula $$R{-}N{=}N{-}\overset{\displaystyle O}{\underset{\displaystyle O}{\overset{\|}{\underset{\|}{S}}}}{-}O{-}N{=}N{-}R'$$

wherein R and R' are phenyl groups, which includes phenyl and phenylene as well as substituted phenyl and phenylene groups, wherein the phenyl group is linked directly to an azo group. These groups are exemplified by the various groups attached to azo components of compounds 1–5 and 7–14, columns 3 through 6. The term "phenyl group" also includes groups in which the phenyl group, which is linked directly to an azo group, is attached to a heterocyclic ring. These latter groups are exemplified by the various groups attached to azo components of compounds 2, 5, 6, 7 and 9, columns 3 through 6. These compounds may be regarded as diazo sulfonates, in which the metallic cation of the diazo sulfonates used as starting material has been substituted by a basic diazonium residue. These compounds as a whole should contain at least three benzene rings, which may be phenyl, substituted phenyl or a phenyl group to which a heterocyclic ring is attached.

The diazonium-diazo-sulfonate derivatives of the present invention are practically insoluble in water, but soluble in organic solvents. They are thus well suited for the preparation of a light sensitive material distinguished by its good storageability and eveness of coating. Such light sensitive material is well suited for the photomechanical production of flat printing plates.

There are a great number of diazo sulfonates $R.N{=}N{-}SO_3Na$ which may be considered for the preparation of the diazo sulfonates to be used as light sensitive substances, according to the present invention. With regard to the commercial acceptability of the printing plates prepared from the light sensitive metal foils, it is suggested that the diazo sulfonates $R.N{=}N.SO_3Na$ contain in R neither strongly basic groups nor such groups that render them water soluble, such as $SO_3H$ or COOH. Furthermore, the degree of light sensitivity and the stability of the diazo sulfonates $R{-}N{=}N.SO_3Na$ is of importance. The better their light sensitivity and their stability, the better is the light sensitivity and stability of the diazo sulfonate derivatives which are obtained therefrom.

The diazo sulfonates of the following compounds have proved to be especially useful: amino carbazoles; amino-diphenylene-oxides; 4-amino-diphenyl-amine; p-phenylene-diamines that are acylated at a nitrogen atom and alkoxylated in their aromatic nucleus; mono-amino compounds of alkoxylated diphenyl methane and triphenyl methane.

In the light sensitive compounds which form the light sensitive layer according to the present invention, the cationic component may equally contribute to the light sensitivity of the whole molecule in those cases where diazonium salts are used for their preparation which in themselves are light sensitive. The light sensitivity of the aromatic or heterocyclic diazo sulfonate derivatives may be advantageously influenced by choosing a suitable diazonium salt, so that diazo sulfonates may be used as a starting material which in themselves are only slightly or not at all light sensitive, but are very stable. The highest degree of light sensitivity in the diazo sulfonate/diazonium-salt reaction products, and thus in the layers prepared therewith, is achieved by combining such diazo sulfonates and diazonium salts in which the anionic sulfonate residue as well as the cationic diazonium component are satisfactorily light sensitive.

Compounds in which R and R′ represent higher molecular residues are of special advantage. Such compounds, which are practically insoluble in water, are obtained either by introducing substituents into R and/or R′, or by using diazo sulfonates of polynuclear compounds which are reacted with polynuclear diazonium salts. High molecular compounds may be obtained by causing diazo sulfonates of polyamines to react with diazonium salts of mono-amines or polyamines. High molecular compounds of a similar constitution are formed by causing the diazonium salts of polyamines to react with the diazo sulfonates of aromatic or heterocyclic mono-amines or polyamines. Owing to an accumulation of chromophorous groups these compounds show a deeper color, which is of advantage in processing a finished printing plate from such light sensitive material, because the exposure process can be easily watched.

As a support for the compounds claimed by the present invention, metal is preferred to be used, such as aluminum. It is not necessary to subject such metallic surface to an anodic oxidation or to a chemical treatment before coating it. However, it may be advantageous to roughten the surface by a simple mechanical treatment, e.g. sandblasting. Other equivalent base supports may be used which are per se well known, such as laminated bases of metal-paper, etc.

For the preparation of the light sensitive material, the diazo sulfonate derivatives R—N=N.$SO_3$.N—N—R′ are dissolved in organic solvents, such as, for example, alcohols, aliphatic ethers with free hydroxyl groups, dioxane, or dimethyl formamide, and the solutions are then coated onto the support by way of whirlcoating, spreading or spraying. The resulting layers must be well dried, preferably at temperatures between 80–110° C. As a rule, the dried layers are yellow-colored. When dry, they are exposed to light under a transparent original, using one of the light sources customary in the printing art, preferably an arc lamp. It may be advisable to add alkali-soluble resins to the coating solutions, such as, for instance, non-hardenable alkali-soluble phenol formaldehyde resins, rosin or shellac, as these additions favor the formation of a smooth layer on the support and prevent crystallization of the light sensitive substance in the layer.

The finished printing plate is obtained from the exposed foil by treating it with dilute aqueous solutions of alkaline substances, preferably of secondary or tertiary alkali-metal salts of phosphoric acid, sodium carbonate or sodium bicarbonate. Solutions of 1–10% of the alkali-metal salts have proved to be especially suitable. By this treatment, the unchanged light sensitive substance is removed leaving the surface thereunder oleophobic, whereas the light decomposition product remains on the plate. It may be of advantage to add wetting agents to the treating fluids for the exposed foils. Such a wetting agent may be, for instance, sodium-alkyl-naphthalene sulfonate. From a negative original, a positive image is obtained which is clearly visible against the metallic background and has a good contrast. Thus a negative working process is provided. Since the light decomposition product has oleophilic properties, the imaged areas may be inked with greasy ink after a short rinsing with water, dilute acids or the usual acid fixing agents. In some cases, showering the exposed layer with water may be sufficient to remove the substance from those parts of the layer which during exposure were not struck by light (e.g. the non-imaged areas).

The diazo sulfonate derivatives R.N=N.$SO_3$.N=N.R′ have not been described previously in the literature. They are prepared by reaction of the alkali-metal diazo sulfonates (R.N=N.$SO_3$+alkali metal) with aqueous solutions of aromatic or heterocyclic diazonium salts, preferably in the form of their hydrochlorides. The diazo sulfonate derivatives, which are easily soluble in organic solvents and almost or completely insoluble in water, separate from the reaction solution as a yellow colored precipitate and can be purified by recrystallization from organic solvents. By the influence of light they are transformed into compounds, which, as distinguished from the light sensitive diazo sulfonates, from which they are formed, cannot be retransformed into water-soluble alkali diazo sulfonates by means of dilute alkaline solutions and cannot be hydrolyzed by treating them with water. Thus, a selective separation of the chemically less active light decomposition products, from the undecomposed diazo sulfonate derivatives

R—N=N.$SO_3$.N=N—R′ can be attained by treating the exposed layer with water or a dilute alkaline solution.

The following compounds are discussed in greater detail in the examples:

(1)

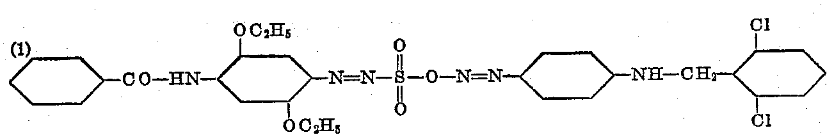

(2)

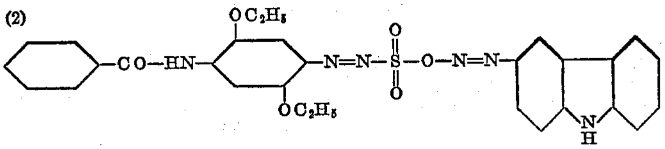

(3)

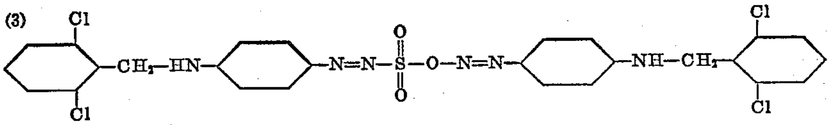

(4)

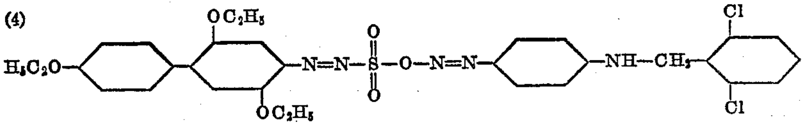

(5)

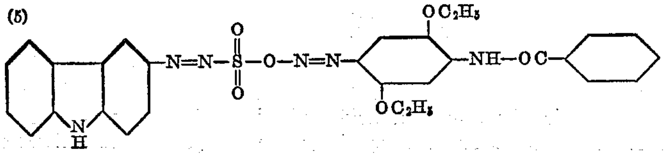

(6)

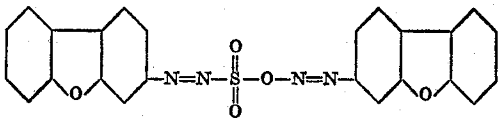

(7)

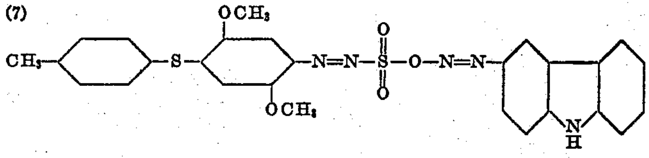

(8)

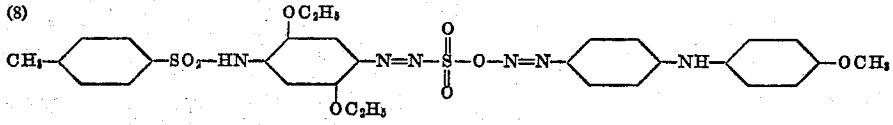

(9)

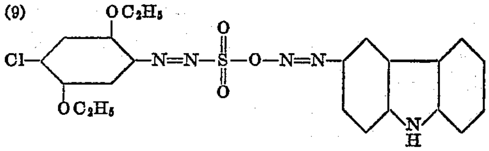

(10)

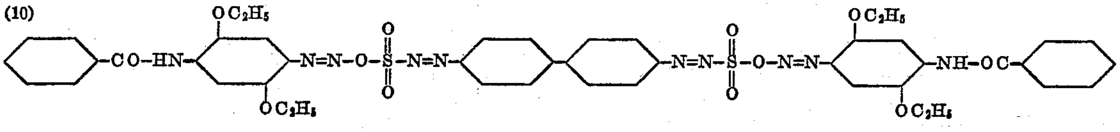

(11)

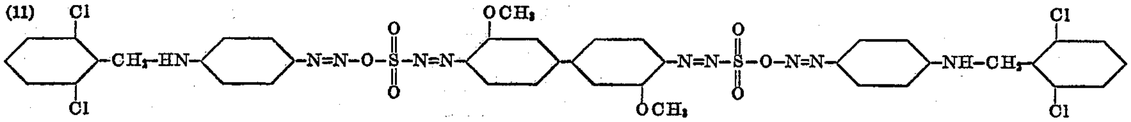

(12)

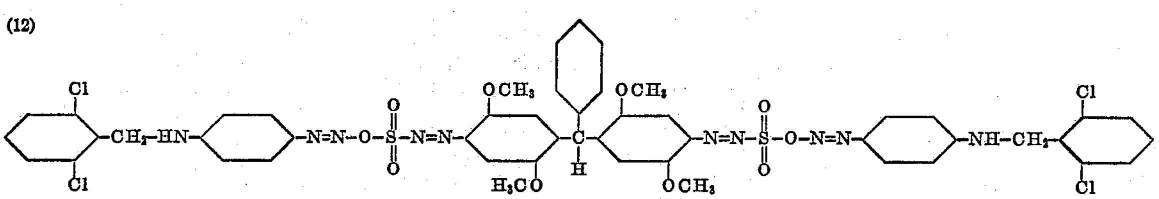

(13)

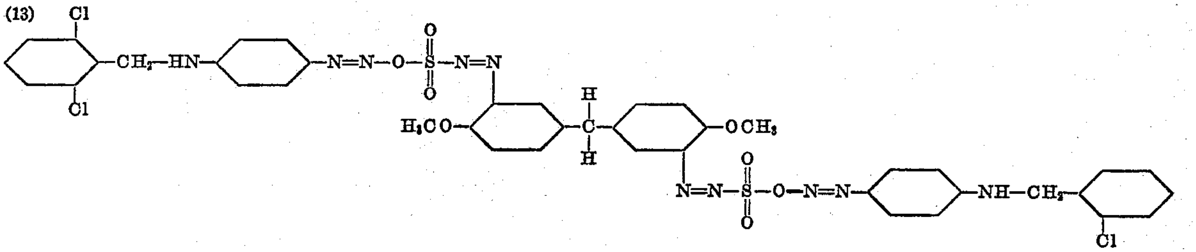

(14)

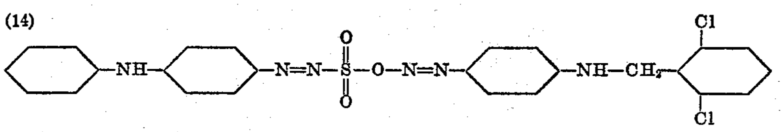

The following examples are inserted for illustrating the invention and it is not intended to limit the scope of the invention to the contents of the examples. The parts indicated in the examples, if not otherwise stated, are by weight.

*Examples*

(1) 1 part of the compound corresponding to Formula 1 is dissolved in 100 parts by vol. of ethylene glycol monomethyl ether, and an aluminum foil with both sides mechanically roughened by brushing is coated on one side with this solution by means of a plate-whirler. The foil, thus sensitized, is first dried with warm air and then, for complete removal of the solvent, drying is continued for about 5 minutes at 80–90° C. in a drying oven. The side of the foil provided with the light sensitive layer is exposed under a negative transparent film original, using for instance a carbon arc lamp of 18 amp. at a distance of 70 cm. for 30–60 seconds. In the light struck areas of the layer, the original green-yellow color turns to a weak grey-red. The exposed layer is then treated with a 1–5% trisodium phosphate solution by wiping over with a cotton swab, thus removing the light sensitive substance in those areas that were not struck by light. The foil is then rinsed with water to remove surplus alkali and wiped over with 1% phosphoric acid to clean the now uncovered areas of the metal foil, Thus from a negative original, a positive image is obtained which is ready for printing. The foil may be inked with greasy ink and used as a printing plate in one of the usual printing apparatuses. Very high printing runs are possible, and even the finest points of a screen are distinctly reproduced.

Equally good printing results are obtained using as the starting material an aluminum foil having a light sensitive layer containing the diazonium diazo sulfonate corresponding to Formula 2 instead of the compound corresponding to Formula 1. For coating the aluminum foil, the compound corresponding to Formula 2 is suitably dissolved in a dimethyl formamide solution.

The compound corresponding to Formula 1 is prepared by adding, drop by drop, a solution of 46 parts of the diazo sulfonate (sodium salt) of 1-benzoyl-amino-2,5-diethoxy-4-amino-benzene in 5 liters of water to a solution of 35 parts of the diazonium chloride, of 1-(2',6'-dichlorobenzyl-amino)-4-aminobenzene in 3,5 liters of water, while cooling and constantly stirring. The water-insoluble reaction product precipitates first in the form of a yellow oil and upon vigorous stirring solidifies to a yellow crystalline mass, which is filtered under reduced pressure, washed with water and dried in the open air. The yield amounts to 54 g. The compound is recrystallized from ethanol and melts at 153° C. with decomposition.

The working method given above for the preparation of the compound corresponding to Formula 1 can be applied analogously, with only small changes, to all reaction products corresponding to the above stated general formula:

$$R—N{=}N—\overset{O}{\overset{\|}{\underset{\underset{O}{\|}}{S}}}—O—N{=}N—R'$$

and in the subsequent examples data are given concerning only the recrystallization procedure as well as the melting point of the respective reaction product.

(2) An anodically oxidized aluminum foil is coated with an ethylene glycol monomethyl ether solution containing 1% of the compound corresponding to Formula 3. The negative image obtained by exposing under a positive original is developed to a finished printing plate following the procedure described in Example 1. The compound corresponding to Formula 3 is recrystallized from ethanol with water being added, and forms greenish-yellow colored crystals which melt at 156–157° C. with decomposition.

If, instead of the compound corresponding to Formula 3, the compound corresponding to Formula 4 is used for coating the foil, the image may be developed by a simple showering with water. After recrystallization from ethanol, the compound corresponding to Formula 4 is obtained in the form of brown-yellow crystals which decompose at 139–140° C.

(3) An aluminum foil with a shiny metallic surface, i.e. so-called rolled aluminum, is freed from greasy spots by a treatment with acetone and then coated as in Example 1 with a solution of 1 part of the compound corresponding to Formula 5 in 100 parts by vol. of a 1:2 mixture of dimethyl formamide and ethylene glycol monomethyl ether. The negative image obtained by exposing the foil under a positive original is wiped over with a 1–5% trisodium phosphate solution and then further treated as described in Example 1 to yield a printing plate.

The compound corresponding to Formula 5 may be recrystallized from ethanol with water added and yields lemon-colored crystals which melt at 155° C. with decomposition.

(4) A solution of 1 part of the compound corresponding to Formula 6 in 100 parts by volume of the solvent mixture used in Example 3 is coated onto an aluminum foil both sides of which had been mechanically roughened. The image obtained by exposing the foil under a negative original is weakly greenish-brown colored and can be transformed into a positive printing plate by developing with 1% trisodium phosphate. The compound corresponding to Formula 6 is light yellow and melts at 126° C. with decomposition.

(5) By analogy to the method described in Example 3 an aluminum foil is coated with the compound corresponding to Formula 7. After exposing the foil under a negative original, a positive image appears in a grey-blue color. This image may be developed with water, or, in order to save time, with a 3–5% trisodium phosphate solution, a positive printing plate being formed.

The compound corresponding to Formula 7 is recrystallized from ethanol and precipitates in the form of yellow crystals. It melts at 145–146° C. with decomposition.

(6) 1 part of the compound corresponding to Formula 8 is dissolved in a mixture of 50 parts by volume of methyl ethyl ketone and 50 parts by volume of ethylene glycol monomethyl ether, and one side of a mechanically roughened alumnium foil is coated with the solution. The sensitized foil is exposed under a transparent negative original and developed by spraying with water, whereupon a weakly gray-blue colored image becomes visible. After a short treatment of the foil with a 1% phosphoric acid, the image may be used for printing.

The compound corresponding to Formula 8 is orange-colored and melts at 138° C. with decomposition, after recrystallization from ethanol.

(7) By analogy to the method described in Example 1 a printing plate is prepared using the compound corresponding to Formula 9. For this purpose, the light sensitive substance is coated onto the support in a solvent mixture consisting of 5 parts by vol. of dimethyl formamide and 1 part by vol. of ethylene glycol monomethyl ether. A suitable developing agent for the positive image, obtained by exposing under a negative original, is a 10% sodium carbonate solution.

The greenish-yellow colored compound corresponding to Formula 9 may be recrystallized from ethanol and melts at 128–129° C. with decomposition.

(8) 1 part of the compound corresponding to Formula 10 and 0.2 part of an alkali-soluble, non-hardenable phenolformaldehyde resin are dissolved in a mixture of 50 parts by vol. of ethylene glycol monomethyl ether and 50 parts by vol. of dimethyl formamide, and a superficially roughened aluminum foil is coated with this solution. The blue-gray colored positive image obtained by exposing the foil under a negative original is developed by swabbing with a 10% sodium bicarbonate solution, and the foil is then shortly wiped over with a 1% phosphoric acid. A positive printing plate is obtained.

The compound corresponding to Formula 10 is of a weak brown-yellow color and melts at 110–112° C. with decomposition, after having previously turned dark.

(9) An aluminum foil with both sides mechanically roughened is coated with a solution containing 1 part of the compound corresponding to Formula 11 dissolved in 100 parts by vol. of 2:1 mixture of dimethyl formamide and ethylene glycol monomethyl ether. The sensitized foil is then dried for 2 minutes at 100° C. After exposure of the foil under a positive transparent original, a weakly copper-colored image becomes visible against a yellow background, which is developed by means of a 5–10% solution of tertiary sodium citrate and may be inked with greasy ink without further treating the foil with dilute acid. A negative image of the original is obtained.

If instead of the compound corresponding to Formula 11 the compound corresponding to Formula 12 or Formula 13 is used as the light sensitive substance, the image is developed by means of a 1–5% trisodium phosphate solution.

The compounds corresponding to Formulae 11, 12 and 13 are purified by recrystallizing them from methanol. The compound corresponding to Formula 11 is of a bright yellow color and melts at 157° C. after having turned dark at 145° C. The compound corresponding to Formula 12 is of a dingy yellow color and melts at 120° C. after having previously turned dark at 100° C. The compound corresponding to Formula 13 is of a dingy yellow color, sinters at 80° C. and starts decomposing at 105° C.

(10) An aluminum foil with a mechanically roughened surface has coated on this surface an ethylene glycol monomethyl ether solution containing 1% of the compound corresponding to Formula 14. After exposure under a negative transparent original, the foil is developed to a positive image using a solution consisting of 4 parts of disodium phosphate, 2 parts of trisodium phosphate and 1 part of 1-diisobutyl-naphthalene-4-sulfonic acid (sodium salt) in 100 parts by volume of water. The developed foil is shortly rinsed with water, then wiped over with an aqueous solution containing 8% of dextrine, 1% of phosphoric acid and 1% of formaldehyde, and finally inked with greasy ink.

The compound corresponding to Formula 14 is a yellow powder which melts at 98–105° C. with decomposition.

What we claim is:

1. A presensitized printing plate comprising a base coated with a layer comprising a compound having the formula $$R-N=N-\overset{\overset{O}{\|}}{\underset{\underset{O}{\|}}{S}}-O-N=N-R_1$$

in which R and $R_1$ are phenyl groups; the compound containing at least three benzene rings.

2. A presensitized printing plate comprising a base coated with a layer comprising a compound having the formula

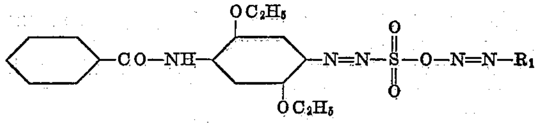

in which $R_1$ is a phenyl group.

3. A presensitized printing plate comprising a base coated with a layer comprising a compound having the formula

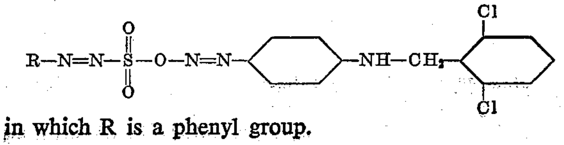

in which R is a phenyl group.

4. A presensitized printing plate comprising a base coated with a layer comprising a compound having the formula

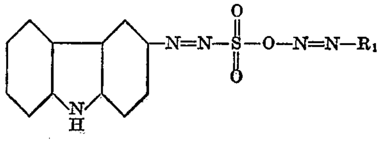

in which $R_1$ is a phenyl group.

5. A presensitized printing plate comprising a base coated with a layer comprising a compound having the formula

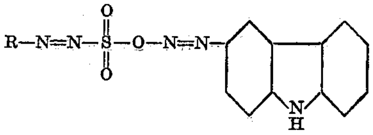

in which R is a phenyl group.

6. A presensitized printing plate comprising a base coated with a layer comprising a compound having the formula

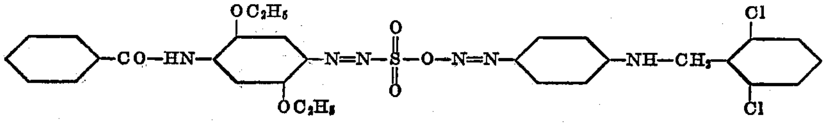

7. A presensitized printing plate comprising a base coated with a layer comprising a compound having the formula

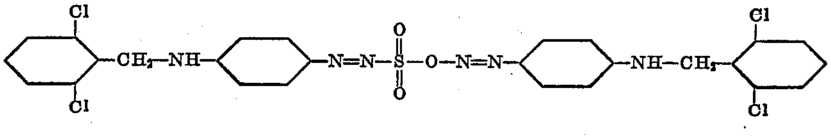

8. A presensitized printing plate comprising a base coated with a layer comprising a compound having the formula

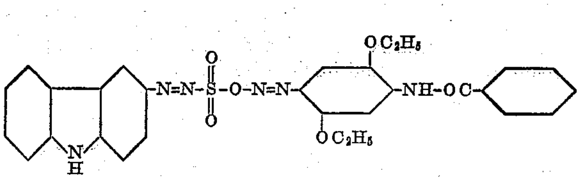

9. A presensitized printing plate comprising a base coated with a layer comprising a compound having the formula

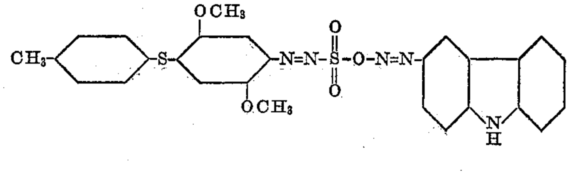

in which $R_1$ is a phenyl group, applying the solution to a base, and drying the solution to form a smooth, light-sensitive layer.

10. A presensitized printing plate comprising a base coated with a layer comprising a compound having the formula

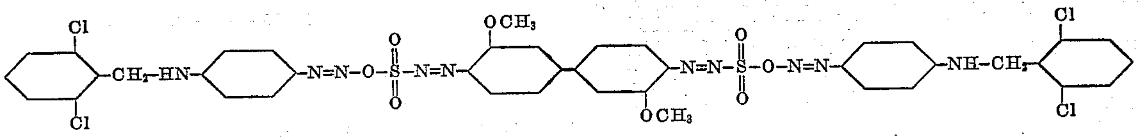

11. A presensitized printing plate according to claim 1 in which the base is an aluminum sheet.

12. A process for preparing a presensitized printing plate which comprises forming a solution in an organic solvent of a compound having the formula

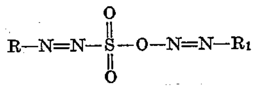

in which R and $R_1$ are phenyl groups; the compound containing at least three benzene rings, applying the solution to a base, and drying the solution to form a smooth, light-sensitive layer.

13. A process for preparing a presensitized printing plate which comprises forming a solution in an organic solvent of a compound having the formula

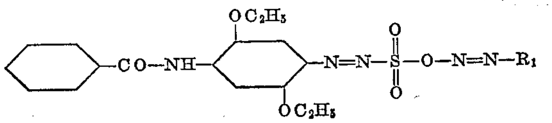

in which $R_1$ is a phenyl group, applying the solution to a base and drying the solution to form a smooth, light-sensitive layer.

14. A process for preparing a presensitized printing plate which comprises forming a solution in an organic solvent of a compound having the formula

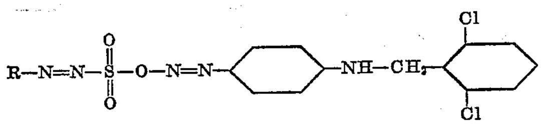

in which R is a phenyl group, applying the solution to a base and drying the solution to form a smooth, light-sensitive layer.

15. A process for preparing a presensitized printing plate which comprises forming a solution in an organic solvent of a compound having the formula

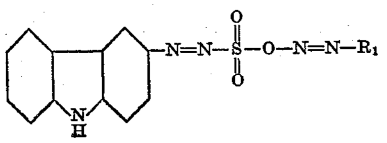

16. A process for preparing a presensitized printing plate which comprises forming a solution in an organic solvent of a compound having the formula

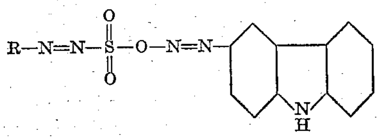

in which R is a phenyl group, applying the solution to a base, and drying the solution to form a smooth, light-sensitive layer.

17. A process for preparing a presensitized printing plate which comprises forming a solution in an organic solvent of a compound having the formula

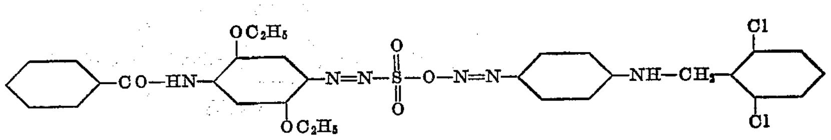

applying the solution to a base, and drying the solution to form a smooth, light-sensitive layer.

18. A process for preparing a presensitized printing plate which comprises forming a solution in an organic solvent of a compound having the formula

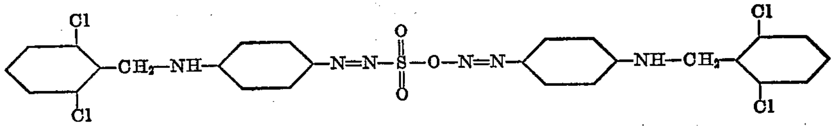

applying the solution to a base, and drying the solution to form a smooth, light-sensitive layer.

19. A process for preparing a presensitized printing plate which comprises forming a solution in an organic solvent of a compound having the formula

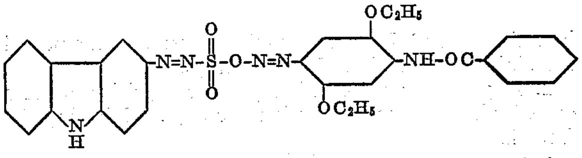

applying the solution to a base, and drying the solution to form a smooth, light-sensitive layer.

20. A process for preparing a presensitized printing plate which comprises forming a solution in an organic solvent of a compound having the formula

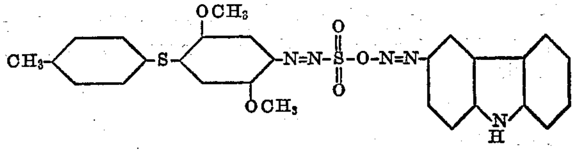

applying the solution to a base, and drying the solution to form a smooth, light-sensitive layer.

21. A process for preparing a presensitized printing plate which comprises forming a solution in an organic solvent of a compound having the formula

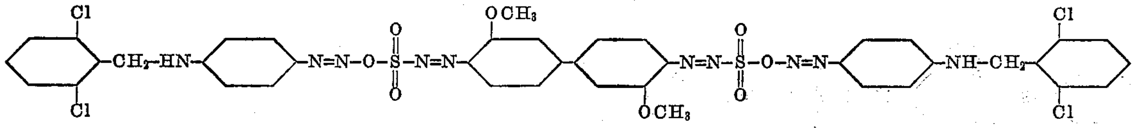

applying the solution to a base, and drying the solution to form a smooth, light-sensitive layer.

22. A process according to claim 12 in which the base is sheet aluminum.

23. A process for preparing a printing plate which comprises forming a solution in an organic solvent of a compound having the formula

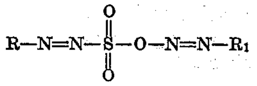

in which R and $R_1$ are phenyl groups; the compound containing at least three benzene rings, applying the solution to a base, drying the solution to form a light-sensitive layer, exposing the layer to light under a master, and treating the exposed layer with a solvent selected from the group consisting of water and a weakly alkaline solution.

24. A process for preparing a printing plate which comprises forming a solution in an organic solvent of a compound having the formula

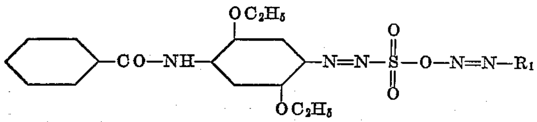

in which $R_1$ is a phenyl group, applying the solution to a base, drying the solution to form a light-sensitive layer, exposing the layer to light under a master, and treating the exposed layer with a solvent selected from the group consisting of water and a weakly alkaline solution.

25. A process for preparing a printing plate which comprises forming a solution in an organic solvent of a compound having the formula

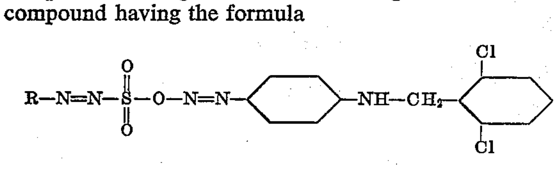

in which R is a phenyl group, applying the solution to a base, drying the solution to form a light-sensitive layer, exposing the layer to light under a master, and treating the exposed layer with a solvent selected from the group consisting of water and a weakly alkaline solution.

26. A process for preparing a printing plate which comprises forming a solution in an organic solvent of a compound having the formula

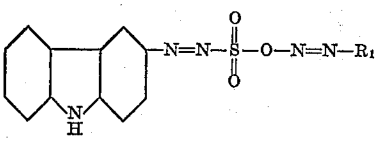

in which $R_1$ is a phenyl group, applying the solution to a base, drying the solution to form a light-sensitive layer, exposing the layer to light under a master, and treating the exposed layer with a solvent selected from the group consisting of water and a weakly alkaline solution.

27. A process for preparing a printing plate which comprises forming a solution in an organic solvent of a compound having the formula

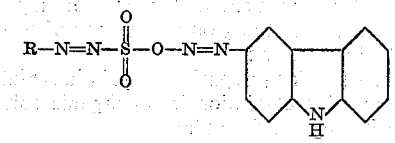

in which R is a phenyl group, applying the solution to a base, drying the solution to form a light-sensitive layer, exposing the layer to light under a master, and treating the exposed layer with a solvent selected from the group consisting of water and a weakly alkaline solution.

28. A process for preparing a printing plate which comprises forming a solution in an organic solvent of a compound having the formula

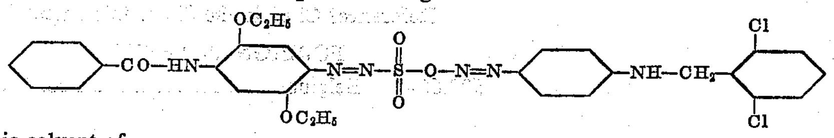

applying the solution to a base, drying the solution to form a light-sensitive layer, exposing the layer to light under a master, and treating the exposed layer with a solvent selected from the group consisting of water and a weakly alkaline solution.

29. A process for preparing a printing plate which comprises forming a solution in an organic solvent of a compound having the formula

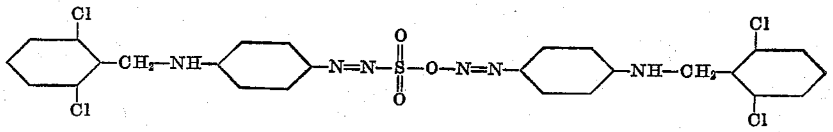

applying the solution to a base, drying the solution to form a light-sensitive layer, exposing the layer to light under a master, and treating the exposed layer with a solvent selected from the group consisting of water and a weakly alkaline solution.

30. A process for preparing a printing plate which comprises forming a solution in an organic solvent of a compound having the formula

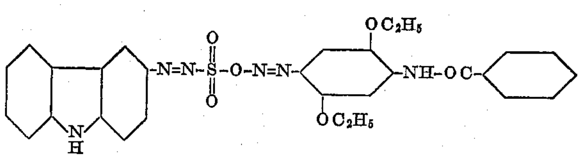

applying the solution to a base, drying the solution to form a light-sensitive layer, exposing the layer to light under a master, and treating the exposed layer with a solvent selected from the group consisting of water and a weakly alkaline solution.

31. A process for preparing a printing plate which comprises forming a solution in an organic solvent of a compound having the formula

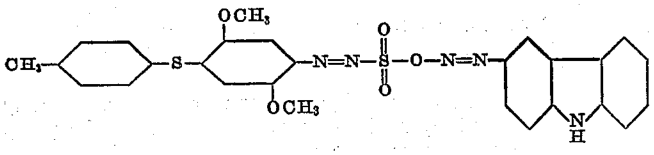

applying the solution to a base, drying the solution to form a light-sensitive layer, exposing the layer to light under a master, and treating the exposed layer with a solvent selected from the group consisting of water and a weakly alkaline solution.

32. A process for preparing a printing plate which comprises forming a solution in an organic solvent of a compound having the formula

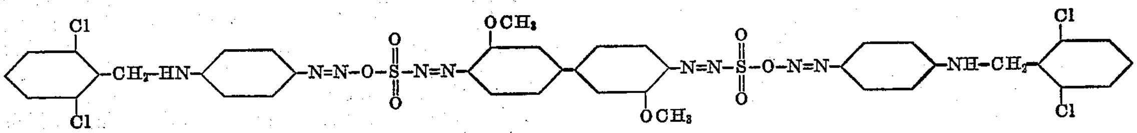

applying the solution to a base, drying the solution to form a light-sensitive layer, exposing the layer to light under a master, and treating the exposed layer with a solvent selected from the group consisting of water and a weakly alkaline solution.

33. A process according to claim 23 in which the base is an aluminum sheet.

References Cited in the file of this patent

FOREIGN PATENTS 508,664 Belgium ---------------- Feb. 15, 1952